Patented Sept. 4, 1951 2,566,709

UNITED STATES PATENT OFFICE 2,566,709

DIAZOTYPE PHOTOPRINTING MATERIALS CONTAINING COLLOIDAL SILICA

William H. von Glahn, Loudonville, and Lester N. Stanley, Delmar, N. Y., assignors to General Aniline & Film Corporation, New York, N. Y., a corporation of Delaware No Drawing. Application October 30, 1947, Serial No. 783,220

8 Claims. (Cl. 95—7)

This invention relates to an improvement in photography, and more particularly to improved diazotype photoprinting material.

In the preparation of diazotype photoprinting material, an absorbent base such as paper is coated or impregnated with a solution containing a light sensitive diazo compound capable of yielding a coloration upon suitable development, e. g., upon coupling with a suitable azo coupling component, and susceptible to modification of its color-forming properties on exposure to light, e. g., by partial or complete decomposition or conversion of the diazo compound to non-color forming products when subjected to actinic illumination.

When a layer containing such a light sensitive diazo compound is exposed to light of locally varied intensity, as under a photographic transparency or a line drawing, and subsequently developed, a reproduction of the original is obtained. In a two component diazotype layer, a light sensitive diazo compound is incorporated together with an azo coupling component, the composition being stabilized to prevent premature coupling. After exposure of the layer to light under a positive transparency or other original to be reproduced, whereby the diazo compound in the illuminated areas is decomposed, the sensitized material is developed, for example, by exposure to an alkaline vapor such as ammonia, or by treatment with an aqueous alkaline solution, to form a positive image of the orginal through coupling of the residual diazo compound with the coupling component.

Diazotype sensitizing compositions are ordinarily applied in the form of an aqueous solution to a suitable carrier or base susceptible to impregnation with such solutions. When an absorptive base such as paper is used, it is desirable to impregnate principally the surface portions thereof with the light sensitive composition, since surplus sensitizing materials penetrating into the body of the paper or other absorbent base not only fail to receive sufficient illumination during exposure to contribute substantially to the formation of an image, but in addition, they tend to cause discoloration of the background portions of the resulting copy. On the other hand, when such carriers are treated to prevent substantial penetration of the sensitizing composition, as by preliminary impregnation or sizing with organic materials, e. g., of resinous nature, the sensitizing composition remaining on the surface of the base tends to form a scum yielding discolored backgrounds and causing uneven distribution of the light sensitive components which interferes with proper rendition of the contrasts of the original to be reproduced. Moreover, organic sizes or impregnating materials often accelerate darkening of the print, and sometimes melt, yielding sticky prints, when subjected to the light and heat employed for exposure of the sensitized material.

It has been proposed to include colloidal clay such as bentonite in diazotype sensitizing compositions which are applied to absorptive carriers, the clay serving to inhibit penetration of the aqueous sensitizing solution into the body of the carrier. While some of the disadvantages resulting from excessive penetration of sensitizing components into the base are thereby avoided, photoprinting material thus prepared is subject to other disadvantages. For example, colloidal clay is relatively opaque to actinic illumination required for formation of the image, and thus tends to mask portions of the sensitizing composition underlying the surface of the light sensitive layer. Sensitized material thus requires relatively long exposure time, and yields relatively thin images.

We have found that the foregoing defects can be overcome by incorporating colloidal silica (i. e., more-or-less hydrated silicic acid or silicon dioxide in aqueous colloidally dispersible form) in the diazotype layer, preferably by including a colloidal dispersion of the colloidal silica in the diazotype sensitizing solution. The colloidal silica thereby fills the interstices of an absorbent carrier such as paper, and largely retains the color-forming components of the diazotype composition at or near the surface. At the same time, the carrier remains sufficiently absorptive toward the aqueous solutions employed to avoid formation of surface scum. Colloidal silica is not affected by heat and light applied during the exposure of photoprinting material containing it, and acquires no coloration on aging. As distinguished from bentonite, we have found that colloidal silica yields prints of much greater density, brightness, sharpness, clarity and definition than could be obtained heretofore, and requires much shorter exposure periods. While it is not desired to limit the invention to any particular theory, it appears that these advantages may result from superior transparency of colloidal silica to actinic illumination. It has been found, moreover, that diazotype sensitized materials containing colloidal silica in accordance with the invention have increased stability to deterioration in storage, that the images produced are fast to washing, and that both background and image areas possess increased fastness to light.

The following examples illustrate a preferred method of making the diazotype photoprinting materials of this invention.

*Example 1*

A paper sheet was impregnated with a diazotype sensitizing composition made up of the following ingredients:

75 cc. of water
25 cc. of an aqueous dispersion of colloidal silica (containing the equivalent of about 3.3 g. of $SiO_2$)
2.2 g. of p-diazo-N,N-diethyl-aniline-zinc chloride double salt
1.5 g. of 7-hydroxy-1,2-naphthimidazole
8 g. of citric acid
5 g. of zinc chloride
4 g. of thiourea After drying, the resulting sensitized paper was exposed to light under a pattern to be reproduced, and the exposed sheet developed by treatment with ammonia vapor. A dense bright maroon print on a clean white background was obtained. The coloration was much brighter and fuller, and the lines more sharply defined, than in the case of a similar print made with paper sensitized with the same ingredients specified above, except that colloidal silica was omitted. The print obtained in accordance with this example was also superior in fastness to washing and light as compared with a similar print prepared without inclusion of colloidal silica. After storage in the dark for 11 months under ambient atmospheric conditions, the sensitized paper of this example again yielded bright maroon prints on a clean white background, whereas the similarly sensitized paper containing no colloidal silica yielded a print of much duller shade at the end of a similar period of storage.

*Example 2*

Paper was impregnated with a composition similar to that of Example 1, except that 2.0 g. of 2,3-dihydroxy-naphthalene-6-sulfonic acid was substituted for the 7-hydroxy-1,2-naphthimidazole of the preceding example. The resulting paper, when exposed to light under a pattern and developed with ammonia, yielded a brilliant blue print on a white background of exceptional clarity. The paper possessed similar stability, and the resulting prints had similar fastness properties to those set out in Example 1.

*Example 3*

Paper was impregnated with a composition similar to that of Example 1, except that in place of the light sensitive diazo compound and azo coupling component of said example, the following materials were employed:

4 g. of p-diazo-N-methyl-N-2′-hydroxyethyl-aniline-zinc chloride double salt
3.2 g. of resorcinol Upon exposing the resulting paper under a pattern to actinic light, and development with ammonia vapor, sepia prints were obtained which were brighter and more dense than prints made in like manner from paper similarly sensitized except that it contained no colloidal silica.

*Example 4*

Paper was coated with the following composition dissolved in sufficient water to yield a volume of 100 cc.:

5 g. of p-diazo-N-ethyl-o-toluidine-zinc chloride double salt
1.7 g. resorcinol
0.8 g. 2,3-dihydroxy-naphthalene-6-sulfonic acid
0.16 g. 2,3-dihydroxy-naphthalene
10 g. citric acid
1.5 g. phosphoric acid
5 g. zinc chloride
5 g. thiourea
2 cc. isopropanol
6 cc. glycol
0.1 g. saponin
25 cc. of an aqueous dispersion of colloidal silica, similar to that of Example 1

After drying the paper, it was exposed to light under a suitable pattern, and developed as in Example 1. A black image on a white background was obtained wherein the image was more dense and of purer jet black color than a print obtained with paper sensitized with a composition similar to that set out above, except that it contained no colloidal silica.

The amount of colloidal silica employed varies depending upon the nature of the paper or other absorbent carrier used, and the composition of the sensitizing solution. In general, the amount of colloidal silica is equivalent to 3 to 10 grams of $SiO_2$ per 100 cc. of said solution. The proportion of colloidal silica to the other non-volatile components of the sensitizing composition, remaining on the carrier after drying, may vary widely, but is generally such that the equivalent $SiO_2$ content of the sensitized material amounts to 1 to 30% of the total dried composition deposited on the carrier. Any form of colloidal silica yielding a colloidal aqueous dispersion—generally colloidally soluble silicic acid of various degrees of hydration—can be used. The dispersion employed can contain an emulsifying or dispersing agent to stabilize the colloidal suspension of the colloidal silica.

If desired, the paper or other absorbent carrier can be impregnated with colloidal silica in aqueous dispersion before application of the sensitizing composition. However, since this procedure would involve an additional step, inclusion of the colloidal silica in the sensitizing solution is preferred.

Colloidal silica can be incorporated with similarly advantageous results in a one-component diazotype sensitizing composition, containing a light sensitive diazo compound but no coupling component, such compositions being developed by application of a coupling component in an aqueous developer solution. Marked improvement in the sharpness of the copies obtained by this procedure is observed, particularly by reason of the improved fastness to washing afforded by the presence of colloidal silica in the light sensitive layer.

The absorbent carrier employed is generally paper, although other absorbent bases such as cardboard, cloth and other textile fabrics, asbestos, plaster, porous stone and the like can be sensitized in accordance with the invention to obtain similarly advantageous results.

Such variations and modifications as will be obvious to those skilled in the art can be made in this invention without departing from the scope or nature thereof.

We claim:

1. Diazotype photoprinting material having a light sensitive layer comprising colloidal silica, and a light sensitive diazo compound, said colloidal silica and said light-sensitive diazo compound being intermingled in the same layer.

2. Diazotype photoprinting material having a light sensitive layer comprising colloidal silica, a light sensitive diazo compound and an azo coupling component, said colloidal silica, said coupling component and said light-sensitive diazo compound being intermingled in the same layer.

3. Diazotype photoprinting material comprising an absorbent base impregnated with colloidal silica, and with a sensitizing composition containing a light sensitive diazo compound, said colloidal silica and said sensitizing composition being intermingled in the same layer on said absorbent base.

4. Diazotype photoprinting material comprising an absorbent base impregnated with a sensitizing composition containing colloidal silica and a light sensitive diazo compound.

5. Diazotype photoprinting material comprising paper impregnated with a sensitizing composition containing colloidal silica and a light sensitive diazo compound.

6. A process for preparing diazotype photoprinting material, comprising the steps of applying to a surface of an absorbent carrier, an aqueous solution containing a light sensitive diazo compound and having colloidal silica colloidally dispersed therein, and drying said solution on said carrier.

7. A process for preparing diazotype photoprinting material, comprising the steps of applying to a surface of a paper sheet, an aqueous solution containing a light sensitive diazo compound and an azo coupling component, and having colloidal silica colloidally dispersed therein, and drying said solution on the paper.

8. A process for preparing diazotype photoprinting material, comprising the steps of applying to a surface of a paper sheet, an aqueous solution containing a light sensitive diazo compound and an azo coupling component, and having colloidal silica colloidally dispersed therein in an amount equivalent to 3 to 10 grams of $SiO_2$ per 100 cc. of said solution, and drying said solution on the paper.

WILLIAM H. VON GLAHN.
LESTER N. STANLEY.

REFERENCES CITED

The following references are of record in the file of this patent:

UNITED STATES PATENTS

| Number | Name | Date |
|---|---|---|
| 1,989,879 | Murck | Feb. 5, 1935 |
| 2,317,521 | Crowley et al. | Apr. 27, 1943 |
| 2,433,515 | Johoda | Dec. 30, 1947 |